United States Patent
Nardini et al.

(10) Patent No.: US 7,469,372 B2
(45) Date of Patent: Dec. 23, 2008

(54) SCAN SEQUENCED POWER-ON INITIALIZATION

(75) Inventors: Lewis Nardini, Richardson, TX (US); Alan D. Hales, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 364 days.

(21) Appl. No.: 11/381,624

(22) Filed: May 4, 2006

(65) Prior Publication Data

US 2006/0259838 A1 Nov. 16, 2006

Related U.S. Application Data

(60) Provisional application No. 60/680,635, filed on May 13, 2005.

(51) Int. Cl.
*G01R 31/28* (2006.01)
(52) U.S. Cl. ..................................... 714/726
(58) Field of Classification Search ................. 714/726
See application file for complete search history.

(56) References Cited

U.S. PATENT DOCUMENTS

| | | | |
|---|---|---|---|
| 5,404,543 A * | 4/1995 | Faucher et al. ............... 713/323 |
| 6,427,218 B2 * | 7/2002 | Takeoka ..................... 714/738 |
| 6,449,755 B1 * | 9/2002 | Beausang et al. .............. 716/5 |
| 6,480,980 B2 * | 11/2002 | Koe ........................... 714/738 |
| 6,516,432 B1 * | 2/2003 | Motika et al. ................ 714/732 |
| 6,668,347 B1 * | 12/2003 | Babella et al. ............... 714/733 |
| 6,686,759 B1 * | 2/2004 | Swamy ....................... 324/765 |
| 6,934,898 B1 * | 8/2005 | Goff ........................... 714/727 |
| 7,210,109 B2 * | 4/2007 | Caron et al. .................. 716/4 |
| 7,308,634 B2 * | 12/2007 | Kiryu ........................ 714/733 |
| 2002/0013921 A1 * | 1/2002 | Takeoka ..................... 714/744 |
| 2002/0124218 A1 * | 9/2002 | Kishimoto ................... 714/738 |
| 2003/0110457 A1 * | 6/2003 | Nadeau-Dostie et al. ........ 716/4 |

* cited by examiner

*Primary Examiner*—James C Kerveros
(74) *Attorney, Agent, or Firm*—Robert D. Marshall, Jr.; W. James Brady; Frederick J. Telecky, Jr.

(57) ABSTRACT

A scan sequenced initialization technique supplies a predefined power-on state to a device or module without using explicit reset input to the registers. This technique supplies a predefined pattern to parallel scan chains following power-on reset. The predefined pattern places the device or module in a architecturally specified reset state. The parallel scan chains are required for structural manufacturing test. Once the power-on reset scanning is complete, the power-on reset sequencer indicates completion of state initialization to other circuits.

13 Claims, 1 Drawing Sheet

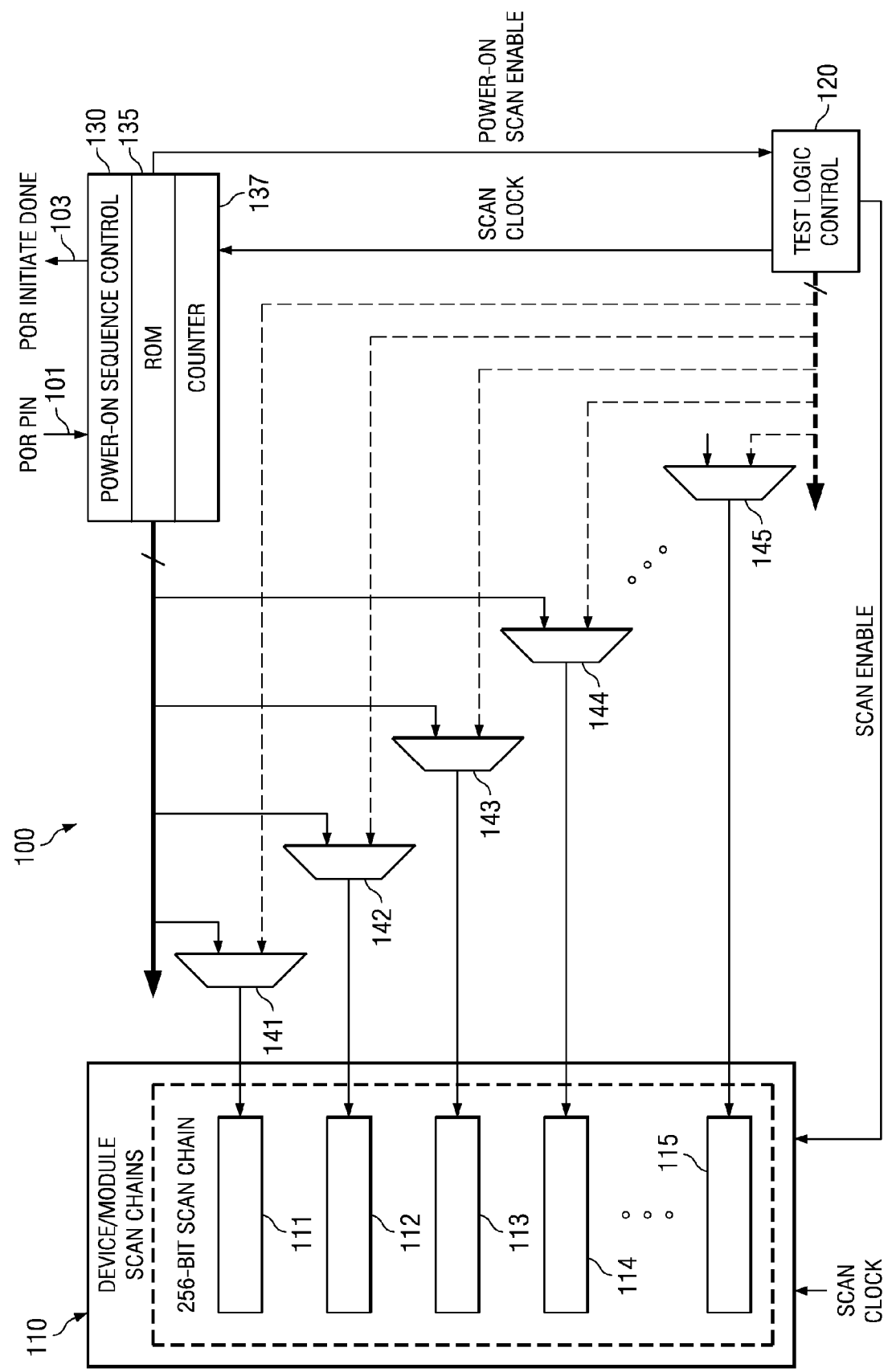

SCAN SEQUENCED POWER-ON INITIALIZATION

CLAIM OF PRIORITY

This application claims priority under 35 U.S.C. 119(e)(1) to U.S. Provisional Application No. 60/680,635 filed May 13, 2005.

TECHNICAL FIELD OF THE INVENTION

The technical field of this invention is initialization of integrated circuit electronics.

BACKGROUND OF THE INVENTION

A guaranteed power-on initialization state in complex SOC designs is essential to ensure proper silicon functionality. This also enables robust functional manufacturing test patterns. This can be difficult and expensive to achieve for large designs, if a reset of each state element is performed. Such a technique tends to create design process inefficiency associated with gate-level netlist bring-up by requiring much time to be spent with initialization issues.

SUMMARY OF THE INVENTION

A scan sequenced initialization technique supplies a predefined power-on state to a device or module without using explicit reset input to the registers. This invention supplies a predefined pattern to parallel scan chains following power-on reset. These parallel scan chains are already required for structural manufacturing test. Once the power-on reset scanning is complete, the power-on reset sequencer indicates completion of state initialization to other circuits. These other circuits are those which interact with the module or device using this invention.

BRIEF DESCRIPTION OF THE DRAWINGS

These and other aspects of this invention are illustrated in the drawings, in which:

FIG. 1 illustrates the circuits of this invention.

DETAILED DESCRIPTION OF PREFERRED EMBODIMENTS

FIG. 1 illustrates a conceptual block level diagram of system 100 of this invention. System-on-chip module 110 includes plural scan chains 111, 112, 113, 114 and 115 for manufacturing test. In this example each of these scan chains 111, 112, 113, 114 and 115 includes 256-bit chains. These scan chains 111, 112, 113, 114 and 115 are fed by either the test control logic 120 or power-on sequencer 130.

Upon initial application of electrical power or upon a predetermined signal on the power-on-reset (POR) pin 101, power-on sequence control 130 supplies a power-on scan enable signal to test control logic 120. Test control logic 120 responds by supplying a scan enable signal to scan chains 111, 112, 113, 114 and 115. As known in the art, the scan enable signal changes SOC module 110 from an operational mode to a scan-in mode. In the scan-in mode various register bits of SOC module 110 are connected into one or more serial scan chains. The example of FIG. 1 includes five such scan chains 111, 112, 113, 114 and 115. Also as known in the art, application of a scan clock controlled by test logic control 120 causes data to shift along each scan chain 111, 112, 113, 114 and 115 from an input to an output.

In response to the power-on scan enable signal, test logic 120 does not supply inputs to scan chains 111, 112, 113, 114 and 115. Instead test logic 120 controls multiplexers 141, 142, 143, 144 and 145 to select signals from power-on sequence control 130. Power-on sequence control 130 supplies predetermined input patterns to the scan chains 111, 112, 113, 114 and 115 via the corresponding multiplexers 141, 142, 143, 144 and 145. The pattern applied to the module can be an architecturally specified reset state or a safe power-on state, such as all zeros. These patterns may be read from a read only memory 135 into the scan chains. Alternatively, these scan patterns may be generated by any suitable scan generator.

Power-on reset sequence control 130 operates for a number of scan clock cycles to completely fill the longest of the scan chains 111, 112, 113, 114 and 115. In the example of FIG. 1 the longest scan chain is 256 bits. Thus each scan chain 111, 112, 113, 114 and 115 is fed a pattern of 256 bits. Following completion of 256 scan clock cycles, which may be measured by a counter 137 within power-on sequence control 130, power-on sequence control 130 stops generation of the power-on scan enable signal. Test control logic 120 responds by no longer generating the scan enable signal. Scan-in of data via scan chains 111, 112, 113, 114 and 115 then stops. Test control logic 120 then controls multiplexers 141, 142, 143 and 145 to select pattern data from test control logic 120 rather than from power-on sequence control 130. Also upon time out of the scan chain length, power-on sequence control 130 generates a power-on reset (POR) initialization done signal on external pin 103. This enables devices external to system 100 to determine when power-on initialization is complete. Note following power-on initialization, test control logic 120 operates according to the known art to permit manufacturing test by scanning in one or more states for test.

Those skilled in the art would recognize that multiplexers 141, 142, 143, 144 and 145 could be replaced by wired ORs. When power-on sequence control 130 supplies initialization input pattern(s), test logic control 120 supplies zeros. Thus only the initialization input pattern is supplied to the corresponding scan input. Similarly power-on sequence control 130 would supply zeros when test logic control 120 supplies test pattern(s). This reduces the complexity of multiplexers 141, 142, 143, 144 and 145 at the expense of requiring zero outputs from test logic control 120 and power-on sequence control 130 when not selected.

This invention does not rely on explicit reset terms on register elements to force a power-on reset value. Instead uses a serial scan technique to apply the values. This invention uses hardware which would already be present in SOC designs. Therefore the overhead in guaranteeing the important initialization state using this invention is cheap and reliable. This invention offers some relief to timing overhead associated with reset on the register to register paths. With SOCs having increasing clock speeds this enables fast initialization without timing overhead. This invention also reduces the overhead on power and area associated with dedicated reset terms to support equivalent means of power-on initialization.

What is claimed is:

1. A method of initialization of an integrated circuit including a scan chain with a scan chain input, the scan chain having an operation mode and a scan-in mode comprising the steps of:

upon initial application of electric power to the integrated circuit setting the scan chain into the scan-in mode;

supplying a predetermined initialization input pattern to the scan chain input, said predetermined initialization input pattern operable to place the integrated circuit in an architecturally specified reset state;

shifting said initialization input pattern into the scan chain for a predetermined number of scan clock cycles; and following said step of shifting said initialization pattern into the scan chain setting the scan chain into the operation mode.

2. The method of claim 1, wherein:

said initialization input pattern is all zeros.

3. The method of claim 1, further comprising the step of:

signaling initialization reset done after said predetermined number of scan clock cycles.

4. An integrated circuit comprising:

a scan chain with a scan chain input, the scan chain having an operation mode and a scan-in mode;

a power-on sequence control circuit operable upon initial application of electric power to the integrated circuit to set the scan chain into the scan-in mode, supply a predetermined initialization input pattern to the scan chain input, said predetermined initialization input pattern operable to place the integrated circuit in an architecturally specified reset state, shift said initialization input pattern into said scan chain for a predetermined number of scan clock cycles, and following the shift of said initialization pattern into the scan chain setting the scan chain into the operation mode.

5. The integrated circuit of claim 4, wherein:

said initialization input pattern supplied by said power-on sequence control circuit is all zeros.

6. The integrated circuit of claim 4, wherein:

said power-on sequence control circuit is further operable to signal initialization reset done after said predetermined number of scan clock cycles on an integrated circuit pin.

7. The integrated circuit of claim 4, wherein:

said power-on sequence control circuit is further operable to supply a power-on scan enable signal upon initialization of the integrated circuit;

said integrated circuit further comprising:

a test logic control circuit connected to said power-on sequence control circuit operable to supply a predetermined test input pattern to the scan chain input at a test time different from said initialization; and a multiplexer having a first input receiving said initialization pattern input, a second input receiving said test pattern input, an output connected to said scan chain input and a control input controlling connection of one of said initialization pattern input or said test pattern input to said multiplexer output;

wherein said test logic control is operable to supply a scan enable signal to said scan chain upon receipt of said power-on scan enable signal, supply a control signal to said control input of said multiplexer upon receipt of said power-on scan enable signal to select said initialization pattern input, end said scan enable signal to said scan chain upon end of said power-on scan enable signal, and supply a control signal to said control input of said multiplexer upon end of said power-on scan enable signal to select said test pattern input.

8. A method of initialization of an integrated circuit including a scan chain with a scan chain input, the scan chain having an operation mode and a scan-in mode comprising the steps of:

upon initial application of electric power to the integrated circuit performing the sequence of setting the scan chain into the scan-in mode, supplying a predetermined initialization input pattern from a first data source to the scan chain input, said predetermined initialization input pattern operable to place the integrated circuit in an architecturally specified reset state, shifting said initialization input pattern into the scan chain for a first predetermined number of scan clock cycles, and setting the scan chain into the operation mode;

thereafter testing the integrated circuit by performing the sequence of setting the scan chain into the scan-in mode, supplying at least one test input pattern from a second data source to the scan chain input, each test input pattern operable to perform structural manufacturing tests on the integrated circuit, shifting said test input pattern into the scan chain for a second predetermined number of scan clock cycles, and setting the scan chain into the operation mode.

9. The method of claim 8, wherein:

said initialization input pattern is all zeros.

10. The method of claim 8, further comprising the step of:

signaling initialization reset done after said first predetermined number of scan clock cycles.

11. An integrated circuit comprising:

a scan chain with a scan chain input, the scan chain having an operation mode and a scan-in mode;

a power-on sequence control circuit including a first data source generating a predetermined initialization input pattern to the scan chain input, said predetermined initialization input pattern operable to place the integrated circuit in an architecturally specified reset state;

a test logic control circuit including a second data source generating at least one test input pattern, each test input pattern operable to perform structural manufacturing tests on the integrated circuit;

a multiplexer having a first input connected to said first data source, a second input connected to said second data source, an output connected to said scan chain input and a control input controlling connection of one of said first and second inputs to said output;

wherein said power-on sequence control circuit is operable upon initial application of electric power to the integrated circuit to perform the sequence of set the scan chain into the scan-in mode, supply said predetermined initialization input pattern from said first data source to said first input of said multiplexer, control said multiplexer to select output of said first input, shift said initialization input pattern into said scan chain for a predetermined number of scan clock cycles, and set the scan chain into the operation mode; and wherein said test logic control circuit is operable following operation of said power-on sequence control circuit to perform the sequence of set the scan chain into the scan-in mode, supply at least one test input pattern from said second data source to the scan chain input, control said multiplexer to select output of said second input, shift said test input pattern into the scan chain for a second predetermined number of scan clock cycles, and
set the scan chain into the operation mode.

12. The integrated circuit of claim 11, wherein:
said initialization input pattern supplied by said power-on sequence control circuit is all zeros.

13. The integrated circuit of claim 11, wherein:
said power-on sequence control circuit is further operable to signal initialization reset done after said first predetermined number of scan clock cycles on an integrated circuit pin.

* * * * *